United States Patent [19]
Choi et al.

[11] Patent Number: 5,661,323
[45] Date of Patent: Aug. 26, 1997

[54] INTEGRATED CIRCUIT FUSE PROGRAMMING AND READING CIRCUITS

[75] Inventors: Jeong-Hyuk Choi, Seoul; Jeong-Hyong Yi; Dong-Jun Kim, both of Kyungki-do, all of Rep. of Korea

[73] Assignee: Samsung Electrics Co., Ltd., Suwon, Rep. of Korea

[21] Appl. No.: 670,506

[22] Filed: Jun. 27, 1996

[30] Foreign Application Priority Data

Jun. 30, 1995 [KR] Rep. of Korea ............... 18971/1995

[51] Int. Cl.$^6$ ................................................. H01L 23/06
[52] U.S. Cl. .................. 257/378; 257/379; 257/528; 257/529; 327/525; 365/177; 365/225.7
[58] Field of Search ............................ 257/529, 530, 257/528, 774, 786, 536, 378, 379; 327/525; 365/177, 225.7

[56] References Cited

U.S. PATENT DOCUMENTS

| | | | |
|---|---|---|---|
| 4,460,914 | 7/1984 | te Velde et al. | 257/529 |
| 4,517,583 | 5/1985 | Uchida | 357/41 |
| 4,605,872 | 8/1986 | Rung | 307/465 |
| 5,466,484 | 11/1995 | Spraggins et al. | 257/529 X |
| 5,471,163 | 11/1995 | Childers | 327/525 |
| 5,491,444 | 2/1996 | McClure | 327/525 |
| 5,552,338 | 9/1996 | Kang | 437/170 |
| 5,585,663 | 12/1996 | Bezama et al. | 257/529 |
| 5,587,598 | 12/1996 | Hatanaka | 257/529 X |

FOREIGN PATENT DOCUMENTS

| 4051561 | 2/1992 | Japan | 257/529 |

OTHER PUBLICATIONS

Greve, "Programming Mechanism of Polysilicon Resistor Fuses", IEEE Transactions on Electron Devices, vol. ED-29, No. 4, Apr. 1982, pp. 719-724.

*Primary Examiner*—William Mintel
*Attorney, Agent, or Firm*—Bell, Seltzer, Park & Gibson

[57] ABSTRACT

An integrated circuit fuse circuit includes a plurality of fuses each connected to an output terminal, and a plurality of fuse programming circuits, a respective one of which is connected between a respective fuse and a reference voltage. Each of the fuse programming circuits includes a pair of complementary bipolar transistors and a field effect transistor. The pair of complementary bipolar transistors produce a large current through the associated fuse in response to a fuse programming signal which is applied to the field effect transistor. The fuse programming circuit may be fabricated in an integrated circuit by providing first and second spaced apart regions of second conductivity type in a well of first conductivity type, and a third region of the first conductivity type in the first region. An insulated gate is provided on the face between the first and second spaced apart regions. An insulated fuse is also provided on the face, electrically connected to the third region.

17 Claims, 3 Drawing Sheets

INTEGRATED CIRCUIT FUSE PROGRAMMING AND READING CIRCUITS

FIELD OF THE INVENTION

This invention relates to integrated circuit devices, and more particularly to integrated circuit devices including fuses.

BACKGROUND OF THE INVENTION

Redundancy techniques are widely used in integrated circuit (semiconductor) memory devices, and other integrated circuit devices, to repair failed memory cells or circuits, in order to improve the device yields. Laser activated fuses are generally used to repair integrated circuits before packaging. Electrically activated fuses, also referred to herein as "electrical fuses", are generally used to repair a failed bit, a failed memory cell or other circuit after the integrated circuit has been packaged. Electrical fuses are also used to program the device for user and/or system requirements.

It is generally desirable for the electrical fuse to have a large current capacity so that it is not inadvertently activated (blown). Accordingly, the fuse is generally designed to have a high voltage and a large current capacity. When a polysilicon fuse or a polycide fuse is used, having a resistance value which ranges from several tens to several hundred ohms, a peak current of several tens to several hundred mA may be needed to reach a temperature of over 1300° C. and thereby blow the fuse. See IEEE Transactions on Electron Devices, Vol. ED-29, No. 4, pp. 719–724, April 1982, entitled "*Programming Mechanism of Polysilicon Resistor Fuses*".

Unfortunately, since the current capability of an MOS transistor which is used as a switching element is generally determined by the ratio of gate width to gate length, the MOS transistor size increases in order to pass large currents. Since an integrated circuit often includes many electrical fuses, the need for large MOS transistors may cause an unwanted increase in the integrated circuit size. The layout of the electrical fuses also may generate unstable peak currents. These disadvantages may prevent the widespread use of electrical fuses in integrated circuit devices.

A known fuse circuit for reading and programming a fuse is disclosed in U.S. Pat. No. 4,517,583, the structure of which is shown herein at FIG. 1. The fuse circuit includes a load PMOS transistor 1 which is connected between a power supply terminal Vpp/Vcc and an output terminal Vout, and has its gate connected to program/read control signals φP/φR. Fuses F1 to Fn are connected in parallel to the output terminal Vout, and fuse select transistors S1 to Sn are connected between each of the fuses and a source line 2, which have their respective gates connected to program/read voltages G1 to Gn. The source line 2 is connected to ground potential Vss (or a substrate voltage).

A single electrical fuse cell is comprised of a single fuse and a single fuse select transistor. For example, upon programming of the fuse F1, a program current supplied from the power source terminal Vpp/Vcc through the load PMOS transistor 1, passes through the fuse F1 and flows to ground potential Vss through the fuse select transistor S1 having the program/read voltage G1 applied to the gate thereof. The temperature in the fuse F1 is raised due to the large amount of current flowing through the fuse F1. As a result, the fuse F1 is blown and the programming operation is completed. During programming, program/read voltages G2 to Gn of 0 volts are applied to the gates of the remaining fuse select transistors S2 to Sn, so that the fuses F2 to Fn corresponding to the fuse select transistors S2 to Sn are not blown.

After programming, a reading operation for reading whether the fuse is blown is performed. At the output terminal Vout, the current path formed through the fuse F1, which is selected by the read voltage supplied from the power source terminal Vpp/Vcc and the program/read voltage G1 applied to the gate of the selected fuse select transistor S1, is detected. The read voltage during the read operation is lower than the programming voltage, in order to prevent an undesired programming of fuses and variation of fuse characteristics.

Unfortunately, in the circuit structure of FIG. 1, a single fuse select transistor for a fuse is employed in the programming and reading operations. The size of the fuse select transistor accordingly increases, in order to pass a large amount of current for programming. The large size of the transistor is not generally needed during the reading operation.

FIG. 2 is a circuit diagram illustrating another conventional fuse circuit, in which separate circuits for programming and reading are provided. In addition to the circuit components of FIG. 1, FIG. 2 includes a read load PMOS transistor 3 which is connected between a power source terminal Vcc and an output terminal Vout, and has its gate connected to the read control signal φR. Read fuse select transistors R1 to Rn are disposed parallel to program fuse select transistors S1 to Sn, and are each connected between the fuses and ground potential Vss. A single electrical fuse cell 5 is comprised of a single fuse, a single program fuse select transistor and a single read fuse select transistor. The read fuse select transistors R1 to Rn may be smaller than the program fuse select transistors S1 to Sn. The programming operation of FIG. 2 is generally the same as that of FIG. 1. In the reading operation, however, the current flowing through the selection of the read fuse select transistor R1, for example, is detected in the output terminal Vout.

The circuit structure of FIG. 2 can overcome problems including the reliability of the fuses and the control of the amount of current, which may not be solved by the circuit of FIG. 1. However, since read fuse select transistors are used in addition to the large program fuse select transistors, a large layout size is generally needed for the fuse select transistors, and the suppression of peak current generated by the large program fuse select transistors may be difficult.

SUMMARY OF THE INVENTION

It is therefore an object of the present invention to provide improved circuits for programming and reading integrated circuit fuses.

It is another object of the present invention to provide programming and reading circuits which allow a reduced sized fuse programming selection transistor.

It is yet another object of the invention to provide integrated circuit fuse programming and reading circuits which allow a reduction of peak current during fuse programming.

These and other objects are provided according to the present invention, by an integrated circuit fuse programming circuit which includes a pair of complimentary bipolar transistors and a field effect transistor. The pair of complementary bipolar transistors produce a large current through a fuse which is connected to the fuse programming circuit, in response to a fuse programming signal which is applied to the field effect transistor.

In particular, integrated circuit fuse circuits according to the invention include a plurality of fuses, each of which is connected to an output terminal. A plurality of fuse programming circuits are also included, a respective one of which is connected between the respective fuse and a reference voltage. Each fuse programming circuit includes a first bipolar transistor having a controlling electrode and a pair of controlled electrodes. The fuse programming circuit also includes a second bipolar transistor and a first field effect transistor, each having a controlling electrode and a pair of controlled electrodes. The controlled electrodes of the second bipolar transistor and the first field effect transistor are connected in parallel between the controlling electrode of the first bipolar transistor and the reference voltage. The controlled electrodes of the first bipolar transistor are connected between the associated fuse and the controlling electrode of the second bipolar transistor.

Integrated circuit fuse circuits according to the present invention may also include a load transistor having a controlling electrode and a pair of controlled electrodes. The controlled electrodes are connected between the power supply voltage and the output terminal. A plurality of second field effect transistors may also be included. The controlling electrodes of a respective one of the second field effect transistors are connected between the controlling electrode of a respective one of the first bipolar transistors and a reference voltage. A fuse programming signal is applied to the controlling electrode of the first field effect transistor of the fuse programming circuit which is connected to the fuse to be programmed. A fuse reading signal is applied to the controlling electrode of the second field effect transistor which is connected to the fuse to be read.

In a particular embodiment of the present invention, the emitter of a respective first bipolar transistor is connected to a respective fuse and a respective collector and base of a respective second bipolar transistor is connected to a respective base and collector of a respective first bipolar transistor. The drain of a respective first field effect transistor is connected to the base of a respective first bipolar transistor. The emitters of the second bipolar transistors and the sources of the first field effect transistors are connected to ground potential.

Integrated circuit fuse circuits according to the present invention may be fabricated in an integrated circuit by providing a fuse cell in a semiconductor substrate. The fuse cell includes a well of first conductivity type in the semiconductor substrate at a face thereof, and first and second spaced apart regions of second conductivity type in the well at the face. A third region of the first conductivity type is located in the first region at the face. An insulated gate is located on the face between the first and second spaced apart regions. An insulated fuse is located on the face, electrically connected to the third region.

The well and the first and third regions define the first bipolar transistor, and the first and second spaced apart regions and the insulated gate therebetween define the field effect transistor. The first and second spaced apart regions and the well define the second bipolar transistor. Preferably, the well is located in a second well of second conductivity type in the semiconductor substrate. Accordingly, a compact fuse cell may be formed in an integrated circuit, wherein the fuse cell includes complementary bipolar transistors and a field effect transistor.

In another aspect of the present invention the fuse itself may be formed on the semiconductor substrate in a step configuration. Specifically, the integrated circuit fuse includes an elongated insulated conductive layer on the integrated circuit substrate. The elongated insulated conductive layer includes a pair of spaced apart relatively wide contact regions and a relatively narrow elongated fuse region extending therebetween and connected thereto. The elongated fuse region defines step transition edges in the pair of contact regions where the elongated fuse region connects to the contact regions. Preferably, the step transition edges extend from the relatively narrow fuse region to the relatively wide contact regions at an angle of between 85° and 95°. Most preferably, the step transition edges extend from the relatively narrow fuse region to the relatively wide contact regions at an angle of 90°.

Integrated circuit fuse circuits employing one or more aspects of the present invention are capable of performing reliable programming and reading operations while reducing the size of the fuse circuit in the integrated circuit.

DETAILED DESCRIPTION OF PREFERRED EMBODIMENTS

Figure 1:
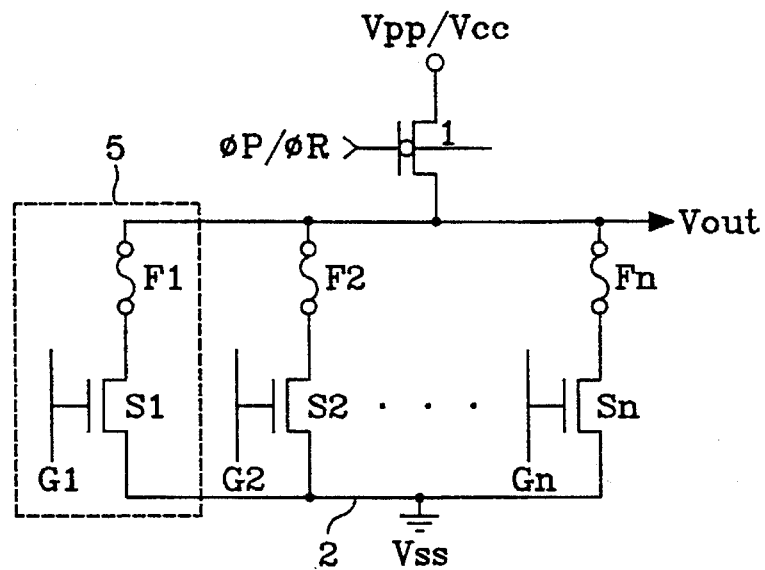
FIG. 1 is a circuit diagram illustrating a conventional electrical fuse circuit structure.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, although terms such as P- or N-type are used herein, each embodiment described and illustrated herein includes its complementary embodiment as well.

Figure 3:
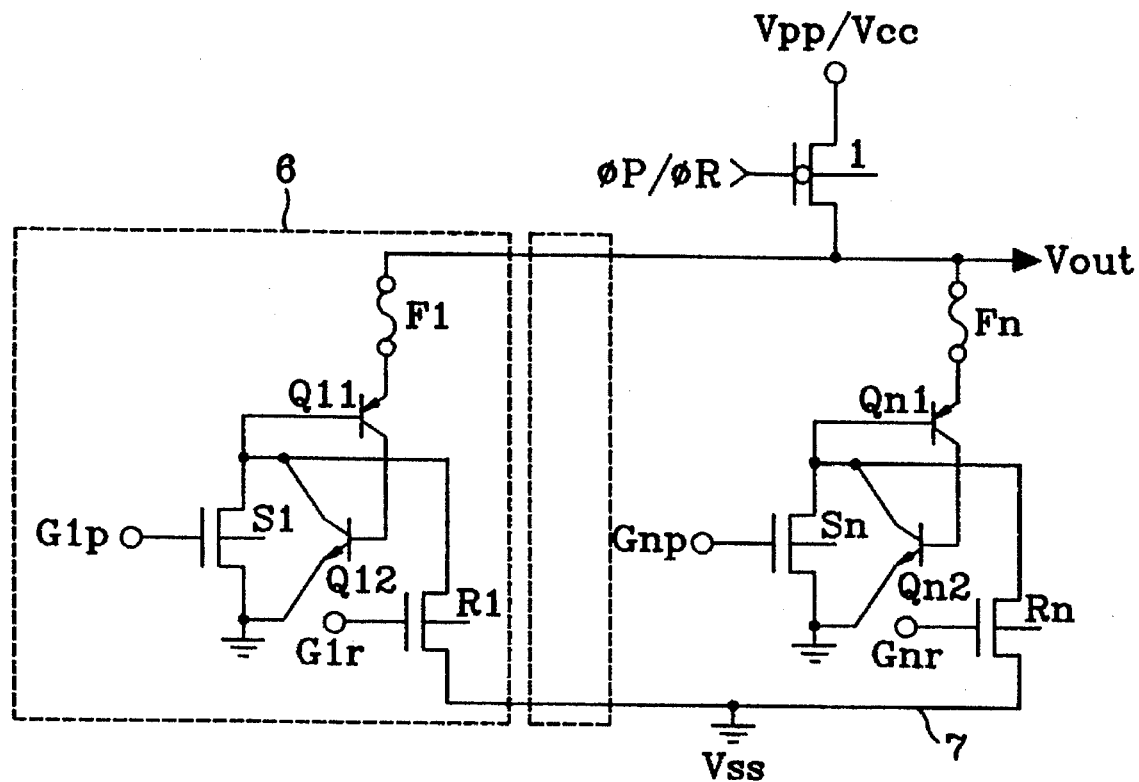
FIG. 3 is a circuit diagram illustrating an electrical fuse circuit according to the present invention.

Referring now to FIG. 3, an integrated circuit fuse circuit according to the present invention includes a load PMOS transistor 1 connected between a power supply (a boosted power supply voltage Vpp or a standard power supply voltage Vcc) and an output terminal Vout. The gate of transistor 1 is connected to a program control signal φP and a read control signal φR. A plurality of fuses F1 to Fn are each connected to the output terminal Vout. A plurality of PNP-type bipolar transistors Q11 to Qn1 have their emitters respectively connected to the fuses F1 to Fn. A plurality of NPN-type bipolar transistors Q12 to Qn2 have their collectors and bases connected to each of the bases and collectors of the PNP-type bipolar transistors Q11 to Qn1.

A plurality of program fuse select transistors S1 to Sn have their drains connected to the bases of the PNP-type bipolar transistors Q11 to Qn1. Their gates are connected to each of program voltages G1p to Gnp, and their sources are each connected to ground potential Vss, together with the emitters of the NPN-type bipolar transistors Q12 to Qn2. A plurality of read fuse select transistors R1 to Rn have their drains connected to each base of the PNP-type bipolar transistors Q11 to Qn1 and their sources connected to a source line 7. Their gates are connected to respective read voltages G1r to Gnr. The source line 7 is connected to ground potential Vss.

Accordingly, a single electrical fuse cell 6 is preferably comprised of a single fuse, a single PNP-type bipolar transistor, a single NPN-type bipolar transistor, and program and read fuse select transistors. As will be described below, PNP-type and NPN-type bipolar transistors Q11 and Q12 in the electrical fuse cell 6 are provided within the area where the MOS type fuse select transistor is formed. The size of the program fuse select transistor S1 may therefore be reduced compared to that of FIGS. 1 and 2.

Figure 4:
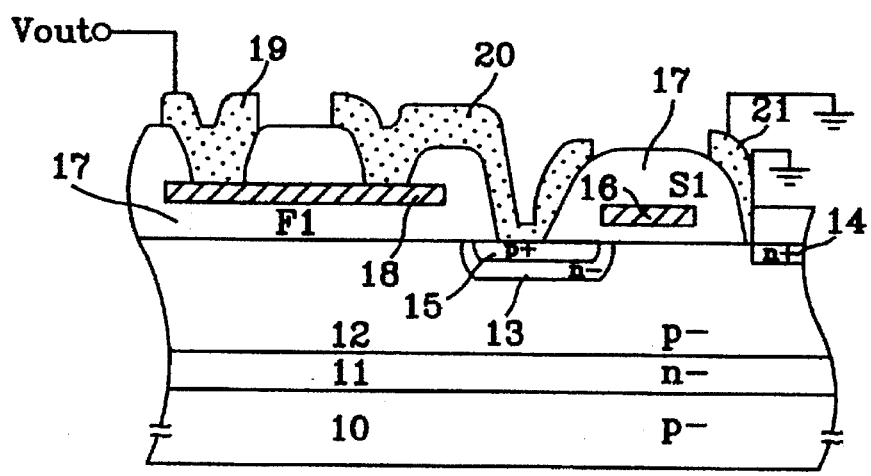
FIG. 4 is a cross-sectional view illustrating the electrical fuse used in FIG. 3.

FIG. 4 shows a cross-sectional view in which the fuse, bipolar transistors and the program fuse select transistor (NMOS transistors) in FIG. 3 are formed. A P-type well (pocket P well) 12 is formed within an N-type well 11, which itself is formed in a P-type semiconductor substrate 10. Within the P-type well 12, an $N^-$ type diffusion area 13 is spaced apart from an $N^+$ type diffusion area 14. A $P^+$ type diffusion area 15 is formed within the $N^-$ type diffusion area 13, thereby forming an $N^-/P^+$ junction area. The substrate between the $N^-$ type diffusion area 13 and the $N^+$ type diffusion area 14 forms the channel of the program fuse select transistor S1.

Still referring to FIG. 4, a polysilicon gate layer 16 is located on the substrate. The polysilicon gate layer 16 is patterned to define the gate of the program fuse select transistor S1. Gate 16 is electrically spaced apart from the substrate area 10 by a gate oxide layer or other insulating layer interposed therebetween. The polysilicon gate layer 16 is also covered with an insulating layer 17. The $N^-$ type diffusion area 13 and $N^+$ type diffusion area 14 are each patterned to form the drain and source of the program fuse select transistor S1.

A polysilicon fuse layer 18 is patterned to define the fuse F1 in FIG. 3. Fuse layer 18 is formed on the insulating layer 17 on the semiconductor substrate 10. One end of fuse F1 is connected to the output terminal Vout of the electrical fuse circuit of FIG. 3 through a first metal layer 19. The other end of fuse F1 is connected to the $P^+$ type diffusion area 15 through a second metal layer 20. The $N^+$ type diffusion area 14 is connected to ground potential Vss through a third metal layer 21.

The $N^-$ type diffusion area 13 may be formed by implanting an impurity such as phosphorus, with an accelerating voltage of 80 KeV to provide a dose concentration of $5 \times 10^{13}$ ions/cm$^2$. The $P^+$ type diffusion area 15 may be formed by implanting an impurity such as boron, with an accelerating voltage of 40 KeV to provide a dose concentration of $2 \times 10^{15}$ ions/cm$^2$.

As shown from the cross-sectional view of FIG. 4, a PNP-type bipolar transistor Q11 is formed, having a base defined by the $N^-$ type diffusion area 13, an emitter defined by the $P^+$ type diffusion area 15, and a collector defined by the P-type well 12. An NPN-type bipolar transistor Q12 is also found, having a collector defined by the $N^-$ type diffusion area 13, a base defined by the P-type well 12, and an emitter defined by the $N^+$ type diffusion area 14. Both bipolar transistors Q11 and Q12 are formed within the structure where the program fuse select transistor S2 is formed.

During a programming operation, if a program voltage G1p is applied to the gate of the fuse select transistor S1, the fuse select transistor S1 is turned on. Then, the bipolar transistor Q11 is turned on and the program current supplied through the load PMOS transistor 1 flows to ground potential Vss through the fuse F1, the bipolar transistor Q11 and the fuse select transistor S1. The program current serves as a base current Ib of the bipolar transistor Q11. Thus, a collector current (Ic=hfe*Ib) based on the current amplification ratio (hfe=Ic/Ib) of the bipolar transistor Q11, is generated from the $N^-$ type diffusion area 13 which is the drain of the fuse select transistor S1. This current then flows to the P-type well 12. Assuming that the current amplification ratio hfe of the bipolar transistor Q1 is ten, the collector current Ic is ten-times as large as the base current Ib, i.e., the current flowing to the drain of the program fuse select transistor S1.

The collector current Ic of the PNP-type bipolar transistor Q11 flowing to the P-type well 12 becomes the base current of the NPN-type bipolar transistor Q12. When the collector current Ic flows through the P-type well 12, a voltage drop of Ic/Rb is generated due to the resistance Rb within the P-type well 12. However, if the voltage in the P-type well 12 is above a threshold voltage, for example, 0.6 volts, of the $P^-/N^+$ junction formed within the P-type well 12 and the $N^+$ type diffusion area 14, the $P^-/N^+$ junction is forward biased. The current flows to ground potential Vss through the emitter of the NPN-type bipolar transistor Q12, i.e., the source of the program fuse select transistor S1. This process is accelerated by the amplification of the NPN-type bipolar transistor Q12, and a large current thus flows to ground potential Vss. Many electrons from the $N^+$ type diffusion area 14 are injected into the P-type well 12 by the forward biased $P^-/N^+$ junction. The injected electrons produce a feedback operation, so that a large current flows to the P-type well 12 due to collision ionization in the drain of the fuse select transistor S1. This current amplification continues until the fuse F1 is heated and is blown.

In order to realize the above described feedback current amplification, it is preferable to operate the NPN-type bipolar transistor Q12 at a low voltage irrespective of the current amplification ratio of the PNP-type bipolar transistor Q11. The amount of current, which is hfe times the drain current of the fuse select transistor S1, flowing to the P-type well 12 in the program operation, flows to ground potential Vss, so that the size of the program fuse select transistor S1 may be reduced. Furthermore, the amplification ratio hfe of the PNP-type bipolar transistor Q11 may be varied in accordance with the base width, as determined by the etching damage or anneal time of the $P^+$ type diffusion area 15 and $N^-$ type diffusion area 13. To decrease the turn-on voltage of the NPN-type bipolar transistor Q12, the P-type well 12 serving as the base area of the NPN-type bipolar transistor Q12 may be divided between the semiconductor substrate 10 and the N-type well 11, and the resistance Rb of the P-type well 12 may be increased.

Accordingly, a current which is about ten times that of the program fuse select transistor S1 flows into the P-type well 12 and then flows to ground potential Vss through the feedback current amplification operation of the NPN-type bipolar transistor Q12. The size of the program fuse select transistor S1 may therefore be reduced by the current amplification ratio hfe of the bipolar transistor Q11.

It will be understood that if the programming voltage is sufficiently high, the NPN-type bipolar transistor may be turned on by the leakage current between the $N^-$ type diffusion area 13 and the P-type well 12 without forming the PNP-type bipolar transistor Q11. This is referred to as the "snap back" phenomenon of a MOS transistor. In a preferred embodiment of the present invention, the fuse select transistor S1 in FIGS. 3 and 4 is comprised of an NMOS transistor, but may be comprised of a PMOS transistor. In this case, the conductivity types of the substrate, well and diffusion area in FIG. 4 are preferably reversed. The drain junction area of the program fuse select transistor is preferably made larger than a heated area of the fuse, thereby preventing the drain junction from being destroyed before the fuse is blown.

Figure 5A:
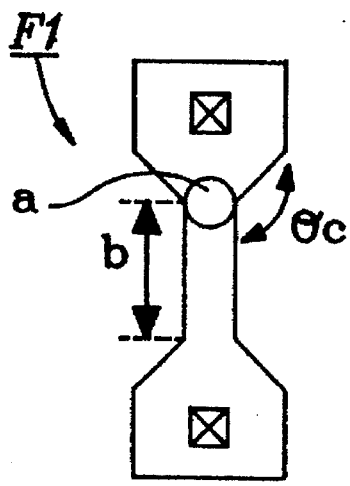
FIGS. 5A and 5B are plan views illustrating structures of a conventional fuse and a fuse designed according to the present invention, respectively.
Figure 5B:
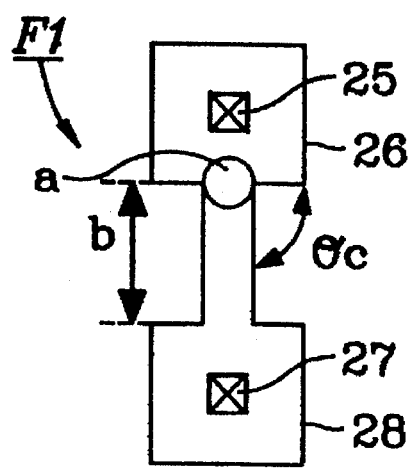

When the temperature of the fuse is raised, the heat is emitted to the insulating layer 17 surrounding the polysilicon fuse layer 18. Reduction of the area where the heat is emitted may improve the reliability of the fuse select transistor and may allow a reduction in the peak current which needs to be generated to blow the fuse. As shown in FIG. 5B, according to the invention, a polysilicon pattern at a cutting position is formed in a step shape, to produce a high temperature due to sudden resistance variation of the cutting position a. It is preferable that the angle $\theta_c$ at which the transistor edge of contact patterns 26 and 28, (which include contact areas 25 and 27 connected to the first and second metal layers 19 and 20), and a fuse region b are connected at the cutting position a, is set to be 85°–95°, and preferably 90° as illustrated. As shown in FIG. 5A, since in a conventional polysilicon pattern, a sloped pattern used adjacent to the fuse cutting position a, the temperature rises slowly and the emitted area is accordingly larger than that of FIG. 5B.

Figure 2:
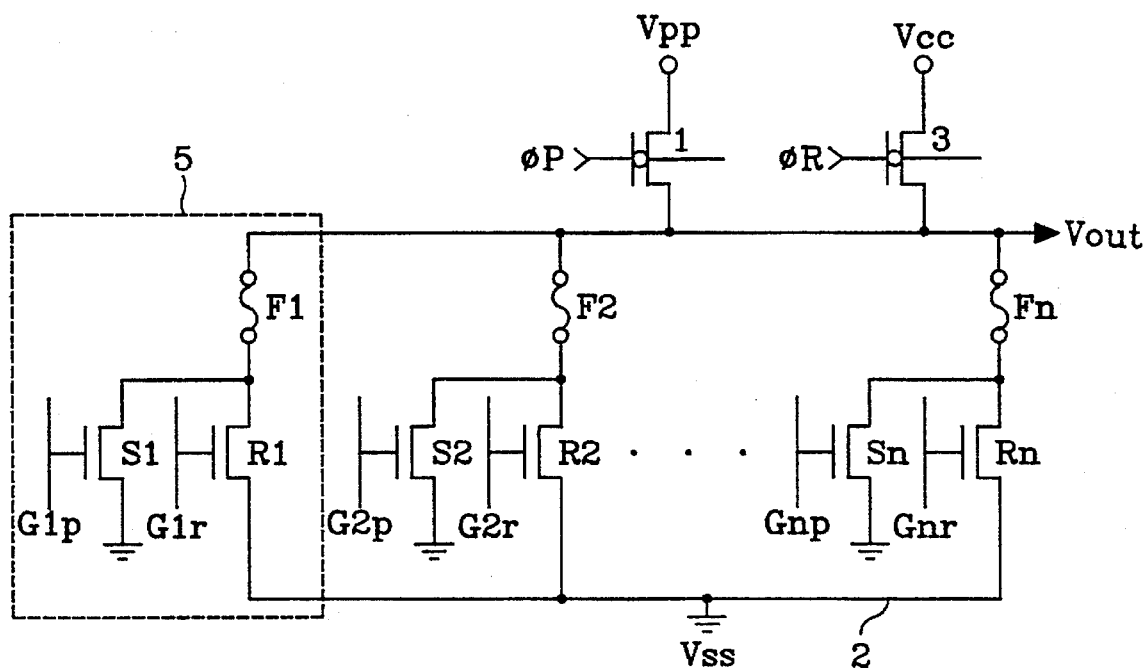
FIG. 2 is a circuit diagram illustrating another conventional electrical fuse circuit structure.

It will be understood that a read operation in the circuit construction of FIG. 3 may be implemented in the same manner as FIG. 2.

As described above, the present invention can perform a reliable fuse programming operation without requiring an increase in the program fuse select transistor size. The peak current to blow the fuse can be reduced. Stable operation of the fuse select transistors can also be achieved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit fuse circuit comprising:
   a plurality of fuses, each connected to an output terminal;
   a plurality of fuse programming and reading circuits, a respective one of which is connected between a respective fuse and a reference voltage, each of said fuse programming and reading circuits comprising:
   a first bipolar transistor having a controlling electrode and a pair of controlled electrodes;
   a second bipolar transistor and a first field effect transistor each having a controlling electrode and a pair of controlled electrodes, the controlled electrodes of both of which are connected in parallel between the controlling electrode of said first bipolar transistor and said reference voltage; and
   a second field effect transistor having a controlling electrode and a pair of controlled electrodes, the controlled electrodes of said second field effect transistor being connected between the controlling electrode of said first bipolar transistor and a reference voltage;
   the controlled electrodes of said first bipolar transistor being connected between the associated fuse and the controlling electrode of said second bipolar transistor.

2. An integrated circuit fuse circuit according to claim 1 further comprising a load transistor, having a controlling electrode and a pair of controlled electrodes, the controlled electrodes being connected between a power supply voltage and said output terminal.

3. An integrated circuit fuse circuit according to claim 1 wherein a fuse programming signal is applied to the controlling electrode of the first field effect transistor of a fuse programming circuit which is connected to a fuse to be programmed.

4. An integrated circuit fuse circuit according to claim 1 wherein a fuse programming signal is applied to the controlling electrode of the first field effect transistor of a fuse programming circuit which is connected to a fuse to be programmed, and wherein a fuse reading signal is applied to the controlling electrode of the second field effect transistor which is connected to a fuse to be read.

5. An integrated circuit fuse circuit comprising:
   a plurality of fuses, each connected to an output terminal;
   a plurality of fuse programming circuits, a respective one of which is connected between a respective fuse and a reference voltage, each of said fuse programming circuits comprising:
   a first bipolar transistor having a controlling electrode and a pair of controlled electrodes; and
   a second bipolar transistor and a first field effect transistor each having a controlling electrode and a pair of controlled electrodes, the controlled electrodes of both of which are connected in parallel between the controlling electrode of said first bipolar transistor and said reference voltage;
   the controlled electrodes of said first bipolar transistor being connected between the associated fuse and the controlling electrode of said second bipolar transistor;

wherein the emitter of a respective first bipolar transistor is connected to a respective fuse;

wherein a respective collector and base of a respective second bipolar transistor is connected to a respective base and collector of a respective first bipolar transistor;

wherein the drain of a respective first field effect transistor is connected to the base of a respective first bipolar transistor; and wherein the emitters of said second bipolar transistors and the sources of said first field effect transistors are connected to ground potential.

6. An integrated circuit fuse circuit comprising:
   a plurality of fuses, each connected to an output terminal;
   a plurality of fuse programming circuits, a respective one of which is connected between a respective fuse and a reference voltage, each of said fuse programming circuits comprising:
   a first bipolar transistor having a controlling electrode and a pair of controlled electrodes; and
   a second bipolar transistor and a first field effect transistor each having a controlling electrode and a pair of controlled electrodes, the controlled electrodes of both of which are connected in parallel between the controlling electrode of said first bipolar transistor and said reference voltage;
   the controlled electrodes of said first bipolar transistor being connected between the associated fuse and the controlling electrode of said second bipolar transistor; and
   wherein each of said fuses and fuse circuits comprises:
   a well of first conductivity type in a semiconductor substrate, at a face thereof;

first and second spaced apart regions of second conductivity type in said well, at said face;

a third region of said first conductivity type in said first region at said face;

an insulated gate on said face, between said first and second spaced apart regions; and an insulated fuse on said face, electrically connected to said third region;

wherein said well and said first and third regions define said first bipolar transistor;

wherein said first and second spaced apart regions and said insulated gate therebetween define said first field effect transistor; and wherein said first and second spaced apart regions and said well define said second bipolar transistor.

7. An integrated circuit fuse circuit according to claim 6 wherein said well is located in a second well of second conductivity type in said semiconductor substrate.

8. An integrated circuit according to claim 6 wherein said insulated fuse comprises:

an elongated insulated conductive layer on said substrate, said elongated insulated conductive layer comprising a pair of spaced apart relatively wide contact regions and a relatively narrow elongated fuse region extending therebetween and connected thereto, said elongated fuse region defining transition edges in said pair of contact regions where said elongated fuse region connects to said contact regions, said transition edges extending from said relatively narrow fuse region to said relatively wide contact regions at an angle of between eighty five degrees and ninety five degrees.

9. An integrated circuit fuse circuit according to claim 1 wherein each of said fuses comprises:

an elongated insulated conductive layer, said elongated insulated conductive layer comprising a pair of spaced apart relatively wide contact regions and a relatively narrow elongated fuse region extending therebetween and connected thereto, wherein said pair of contact regions connect to said elongated fuse region at an angle of between eighty five degrees and ninety five degrees.

10. An integrated circuit fuse circuit comprising:

a plurality of fuses, each connected to an output terminal;

a plurality of fuse programming circuits, a respective one of which is connected between a respective fuse and a reference voltage, each of said fuse programming circuits comprising a pair of complementary bipolar transistors, a first field effect transistor and a second field effect transistor, wherein said pair of complementary bipolar transistors produce a programming current through the respective fuse in response to a fuse programming signal which is applied to said first field effect transistor, and wherein a state of the respective fuse is read by detecting a reading current through said fuse in response to a fuse read signal which is applied to said second field effect transistor.

11. An integrated circuit fuse circuit according to claim 10 further comprising a load transistor connected between a power supply voltage and said output terminal.

12. An integrated circuit fuse circuit comprising:

a fuse; and a fuse programming circuit connected to said fuse and comprising a pair of complementary bipolar transistors, a first field effect transistor and a second field effect transistor, wherein said pair of complementary bipolar transistors produce a programming current through said fuse in response to a fuse programming signal which is applied to said first field effect transistor, and wherein a state of said fuse is read by determining if a read current flows through said fuse in response to a fuse read signal which is applied to said second field effect transistor.

13. A fuse cell for an integrated circuit comprising:

a semiconductor substrate;

a well of first conductivity type in said semiconductor substrate, at a face thereof;

first and second spaced apart regions of second conductivity type in said well, at said face;

a third region of said first conductivity type in said first region at said face;

an insulated gate on said face, between said first and second spaced apart regions; and an insulated fuse on said face, electrically connected to said third region.

14. A fuse cell according to claim 13:

wherein said well and said first and third regions define a first bipolar transistor;

wherein said first and second spaced apart regions and said insulated gate therebetween define a field effect transistor; and wherein said first and second spaced apart regions and said well define a second bipolar transistor.

15. A fuse cell according to claim 13 wherein said well is located in a second well of second conductivity type in said semiconductor substrate.

16. A fuse cell according to claim 13 wherein said insulated fuse comprises:

an elongated insulated conductive layer on said substrate, said elongated insulated conductive layer comprising a pair of spaced apart relatively wide contact regions and a relatively narrow elongated fuse region extending therebetween and connected thereto, said elongated fuse region defining transition edges in said pair of contact regions where said elongated fuse region connects to said contact regions, said transition edges extending from said relatively narrow fuse region to said relatively wide contact regions at an angle of between eighty five degrees and ninety five degrees.

17. A fuse cell for an integrated circuit comprising:

a semiconductor substrate;

a well of first conductivity type in said semiconductor substrate, at a face thereof;

first and second spaced apart regions of second conductivity type in said well, at said face;

an insulated gate on said face, between said first and second spaced apart regions; and an insulated fuse on said face, electrically connected to said first region;

wherein said well is located in a second well of second conductivity type in said semiconductor substrate.

* * * * *